United States Patent
Muto et al.

(10) Patent No.: US 7,493,690 B2
(45) Date of Patent: Feb. 24, 2009

(54) METHOD OF ATTACHING ELECTRONIC COMPONENTS TO PRINTED CIRCUIT BOARD AND ATTACHMENT STRUCTURE THEREOF

(75) Inventors: Shigeru Muto, Takanezawa-machi (JP); Akira Sato, Kakuda (JP); Kohya Shimano, Kakuda (JP); Norio Tamate, Kakuda (JP); Tomoyuki Honda, Kakuda (JP); Takuji Yamamoto, Wako (JP); Kazuhisa Yamamoto, Wako (JP); Takatoshi Ota, Wako (JP); Hiroshi Ikeba, Wako (JP)

(73) Assignees: Keihin Corporation, Tokyo (JP); Honda Motor Co., Ltd., Tokyo (JP)

( * ) Notice: Subject to any disclaimer, the term of this patent is extended or adjusted under 35 U.S.C. 154(b) by 448 days.

(21) Appl. No.: 11/172,991

(22) Filed: Jul. 5, 2005

(65) Prior Publication Data

US 2006/0005996 A1 Jan. 12, 2006

(30) Foreign Application Priority Data

Jul. 6, 2004 (JP) .............................. 2004-199118

(51) Int. Cl.
*H05K 3/34* (2006.01)
(52) U.S. Cl. ........................................ 29/840; 174/260
(58) Field of Classification Search ............ 29/832–841; 174/260; 361/760, 782, 783, 785–791
See application file for complete search history.

(56) References Cited

U.S. PATENT DOCUMENTS

| | | | | |
|---|---|---|---|---|
| 5,500,789 | A | * | 3/1996 | Miller et al. ................. 361/816 |
| 2003/0206392 | A1 | * | 11/2003 | Kawata ....................... 361/631 |
| 2004/0100777 | A1 | * | 5/2004 | Lee ............................ 361/758 |

FOREIGN PATENT DOCUMENTS

| | | | |
|---|---|---|---|
| JP | 60-066069 | | 5/1985 |
| JP | 7135384 | * | 5/1995 |
| JP | 09-321462 | | 12/1997 |
| JP | 11-274682 | | 10/1999 |

OTHER PUBLICATIONS

Japanese Office Action dated Apr. 1, 2008, Application No. 2004-199118.

* cited by examiner

*Primary Examiner*—Jeremy C Norris
(74) *Attorney, Agent, or Firm*—Westerman, Hattori, Daniels & Adrian, LLP.

(57) ABSTRACT

In a method of attaching an electronic component to a printed circuit board by a plurality of screws that are inserted into corresponding through holes cut in the board from a surface of the board and then screwed into corresponding screw holes formed in the component mounted on an opposite surface, the component is screwed onto the board using one of the screws and the component and the screw are soldered onto the board with lead-free solder. After they have been cooled down, the component is screwed onto the board using remaining screws. With this, the strength of the connection between the component and board is improved and also the occurrence of warp of the board and component can be prevented.

5 Claims, 4 Drawing Sheets

PRIOR ART
FIG. 4
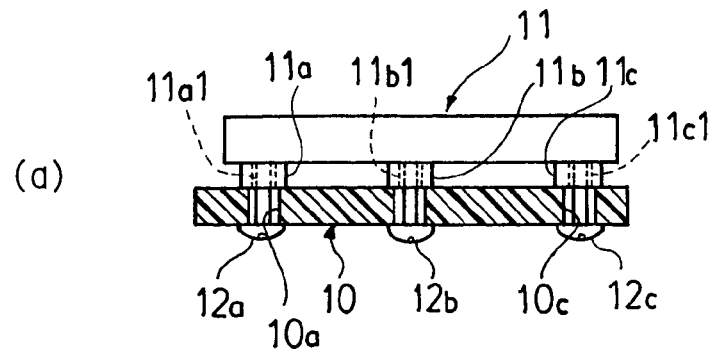
(a)
(b)
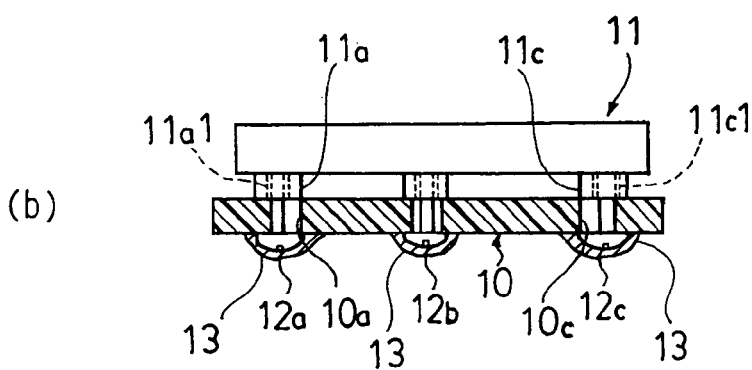
(c)
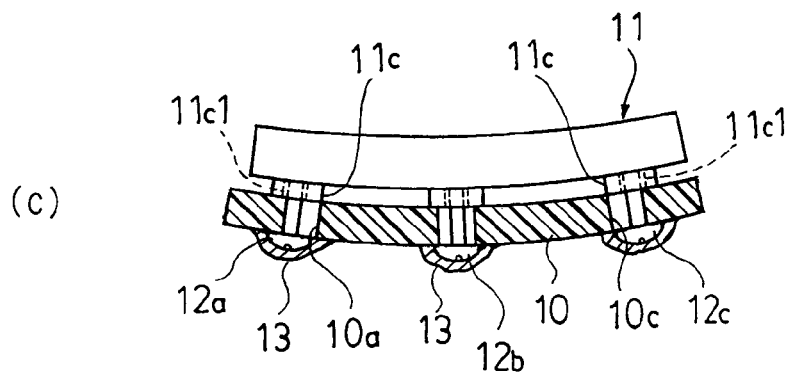

METHOD OF ATTACHING ELECTRONIC COMPONENTS TO PRINTED CIRCUIT BOARD AND ATTACHMENT STRUCTURE THEREOF

BACKGROUND OF THE INVENTION

1. Field of the Invention

This invention relates to a method of attaching electronic components to printed circuit board and an attachment structure thereof.

2. Description of the Related Art

Conventionally, the method of attaching connectors and other relatively large electronic components or parts to printed circuit boards by the use of a plurality of screws is used widely. When electronic components are attached to a printed circuit board using screws, the screws are ordinarily inserted from the solder surface side into through holes cut in the printed circuit board and then screwed into screw holes in electronic components mounted on the mounting surface, as taught in Japanese Laid-Open Patent Application No. Hei 9(1997)-321462, in FIG. 4.

In addition, in order to prevent these screws from coming loose and increase the strength of the connection between the printed circuit board and the electronic components, it is a common practice to lock the screws by soldering their heads at the same time the leads of the electronic components are soldered.

Aside from the above, lead-free solder has recently become widespread due to environmental concerns. Lead-free solder typically has a higher melting point than the conventional eutectic solder, so when soldering is done using lead-free solder, the printed circuit board and electronic components are heated to a temperature higher than that in the case of using conventional eutectic solder.

For this reason, when an electronic component is attached to a printed circuit board with a plurality of screws, and this electronic component is soldered with lead-free solder, differences in the coefficient of linear thermal expansion between the printed circuit board and the electronic component cause them to deform (expand) by different amounts, specifically, the amount of increase in the distance between the plurality of through holes cut in the printed circuit board is different from the amount of increase in the distance between the plurality of screw holes formed in the electronic component, thus giving rise to a shift in the position of the screw holes relative to the through holes.

At this time, the screws that are screwed into the screw holes in the electronic component move laterally within the unthreaded through holes by an amount equal to the difference in the amount of deformation of the electronic component and the printed circuit board, and thus the positions of the screws change relative to the through holes.

If the heads of the screws are soldered and the solder solidifies in this state, the screws will be fixed and locked to the printed circuit board, so even after the printed circuit board and electronic component return to room temperature and contract, the positions of the screws relative to the through holes are unchanged. Therefore, although the difference in the amount of deformation of the printed circuit board and the electronic component can be accommodated by the screw moving laterally within the through hole when expanded, this can no longer occur when contracted.

For this reason, there is a problem in that during the cooling process, the force of shrinkage of either the printed circuit board or the electronic component (whichever has the greatest coefficient of linear thermal expansion) may cause the other to warp (flex) under pressure in the direction of shrinkage.

Such problems arise fundamentally because of differences in the coefficient of linear thermal expansion between the printed circuit board and electronic component, so depending on the material used for the printed circuit board or electronic component, they could occur even when soldering is performed using the conventional eutectic solder that contains lead.

The coefficient of linear thermal expansion of a substance does not necessarily exhibit a linear change with respect to the change in temperature, but rather it may instead increase rapidly at a certain temperature. Accordingly, even below the melting point of conventional eutectic solder (roughly 180° C.), there is a possibility of large differences in the amount of thermal expansion of the electronic component and the printed circuit board depending on the material used, so there is still a risk of warp occurring in the cooling process.

SUMMARY OF THE INVENTION

Accordingly, this invention has as its object to solve the aforementioned problem and provide a method of attaching electronic components to printed circuit board and an attachment structure thereof, whereby, when an electronic component is attached to a printed circuit board by a plurality of screws and soldering is performed including these screws, the strength of the connection between the electronic component and printed circuit board is improved and also the occurrence of warp of the printed circuit board and electronic component can be prevented.

In order to achieve the object, this invention provides in a first aspect a method of attaching an electronic component to a printed circuit board by a plurality of screws that are inserted into corresponding through holes cut in the board from a surface of the board and then screwed into corresponding screw holes formed in the component mounted on an opposite surface, comprising the steps of: (a) screwing the component onto the board using one of the screws; (b) flow soldering the component and the screw onto the board; (c) cooling down the component and the board to a predetermined temperature; and (d) screwing the component onto the board using remaining screws to secure the component to the board, after the component and the board have been cooled down to the predetermined temperature.

In order to achieve the object, this invention provides in a first aspect a structure of attaching an electronic component to a printed circuit board by a plurality of screws that are inserted into corresponding through holes cut in the board from a surface of the board and then screwed into corresponding screw holes formed in the component mounted on an opposite surface, wherein the improvement comprises: one of the screws is soldered and attached to the board.

BRIEF DESCRIPTION OF THE DRAWINGS

The above and other objects and advantages of the invention will be more apparent from the following description and drawings in which:

FIG. 4 is a set of explanatory diagrams illustrating a method of attaching an electronic component to a printed circuit board according to the prior art.

DETAILED DESCRIPTION OF THE PREFERRED EMBODIMENT

Here follows a description of a preferred embodiment of a method of attaching electronic components to printed circuit board and attachment structure thereof according to this invention made with reference to the appended drawings.

Figure 1:
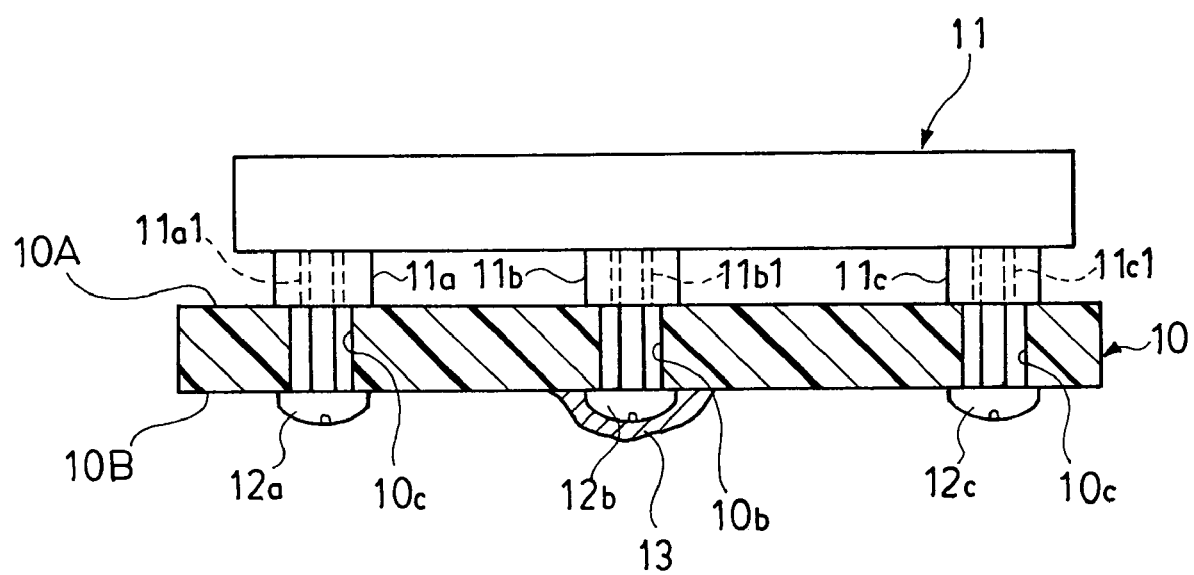
FIG. 1 is a sectional view illustrating an attachment structure of an electronic component to a printed circuit board according to an embodiment of this invention.

FIG. 1 is a sectional view illustrating an attachment structure of an electronic component to a printed circuit board according to an embodiment of this invention.

In FIG. 1, the symbol 10 indicates a printed circuit board. The printed circuit board 10 is made or formed from a typical thermoplastic organic resin and its coefficient of linear thermal expansion is roughly 16 ppm/° C. As one example of an electronic component or part, a connector 11 is mounted on the mounting surface 10A side of the printed circuit board 10. The connector 11 is made from polybutylene terephthalate (PBT) and its coefficient of linear thermal expansion is roughly 55 ppm/° C. The remaining electronic components mounted on the printed circuit board 10 are omitted from the drawing.

Upon the connector 11 are formed a plurality of leg portions, specifically three leg portions (indicated by the symbols 11a, 11b and 11c from left to right in the drawing sheet) that make contact with the mounting surface 10A of the printed circuit board 10. The three leg portions 11a, 11b and 11c are formed at equally spaced intervals on the bottom surface of the connector 11.

Specifically, the leg portion 11a is formed near the left edge of connector 11 (left edge of the drawing sheet), and the leg portion 11c is formed near the right edge of the connector 11 (right edge of the drawing sheet). Moreover, the leg portion 11b is formed at or near the center of connector 11 (midway between the leg portion 11a and leg portion 11c). Screw holes 11a1, 11b1 and 11c1, respectively, are formed in the leg portions 11a, 11b and 11c.

In addition, a plurality of, specifically three through holes (indicated by the symbols 10a, 10b and 10c from left to right in the drawing sheet) are cut in the printed circuit board 10 at positions corresponding to the screw holes 11a1, 11b1 and 11c1. The through holes 10a, 10b and 10c are not threaded.

The connector 11 is attached to the printed circuit board 10 by a plurality of, specifically three screws (indicated by the symbols 12a, 12b and 12c from left to right in the drawing sheet). More specifically, the screws 12a, 12b and 12c are inserted into the respective through holes 10a, 10b and 10c from the solder surface 10B side of the printed circuit board 10, and screwed into the screw holes 11a1, 11b1 and 11c1 of the connector 11. Thus, the connector 11 is attached to or screwed onto the printed circuit board 10. The through holes 10a, 10b and 10c are formed with inside diameters greater than the outside diameters (excluding the heads) of the screws 12a, 12b and 12c so that the screws 12a, 12b and 12c can be easily inserted.

Here, what is characterized in the structure of attaching the electronic component to the printed circuit board according to the present invention is that, the head of only the screw 12b out of the three screws 12a, 12b and 12c is covered with solder, more specifically with the lead-free solder 13, and thus only the screw 12b is affixed to the printed circuit board 10.

The reason for adopting this arrangement will now be explained in conjunction with a description of the method of attaching the connector 11 to the printed circuit board 10 made with reference to FIG. 2 and ensuing figures.

Figure 2:
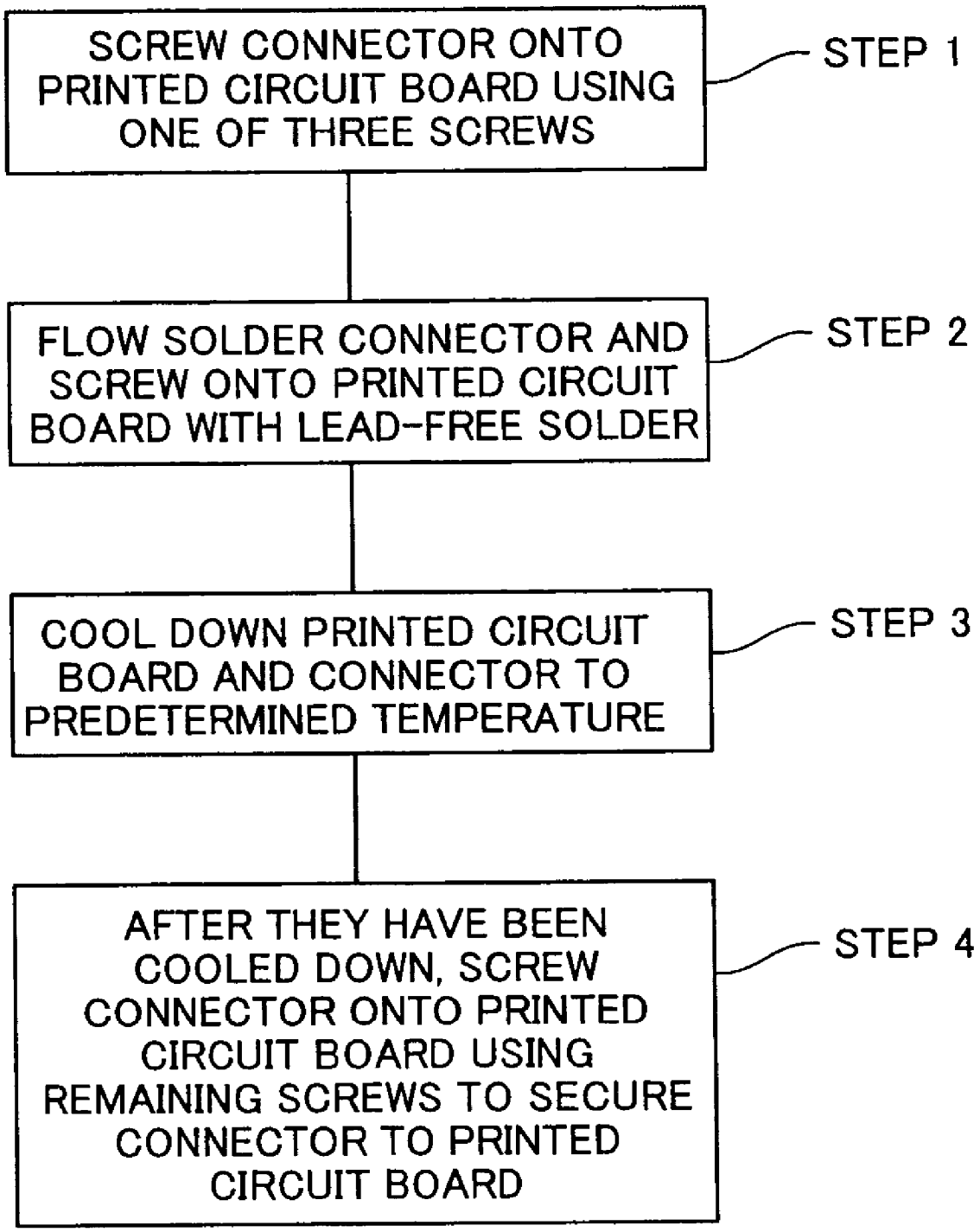
FIG. 2 is a flowchart illustrating the steps in the method of attaching an electronic component to a printed circuit board according to the embodiment of the invention.

FIG. 2 is a flowchart illustrating the steps in the method of attaching an electronic component to a printed circuit board in this embodiment of the invention. FIG. 3A to 3D are a set of explanatory diagrams illustrating the various steps shown in FIG. 2.

Figure 3:
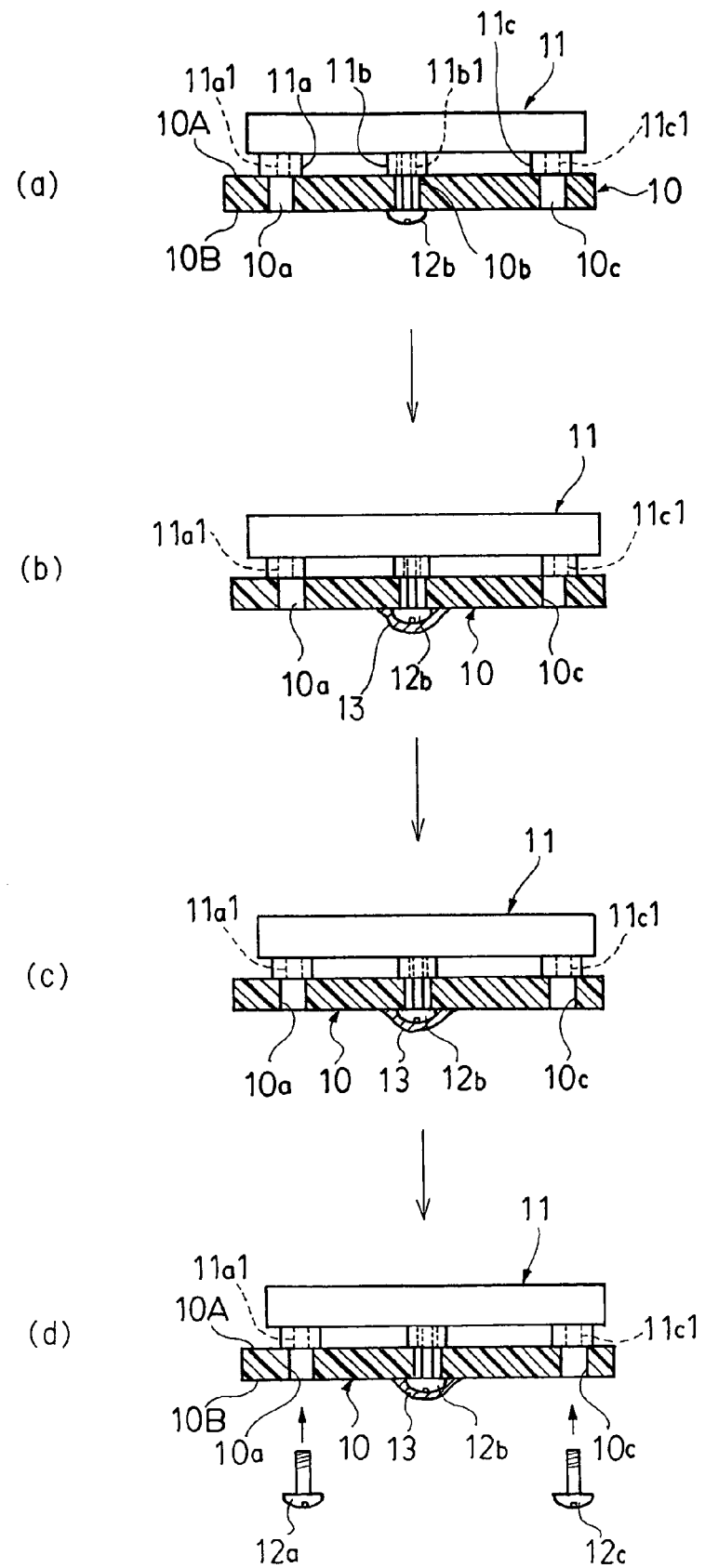
FIG. 3 is a set of explanatory diagrams illustrating the various steps shown in FIG. 2.

For ease of understanding, the description with reference to FIGS. 2 and 3 will be preceded by a description of the method of attaching an electronic component to a printed circuit board according to the prior art shown in FIG. 4.

In the prior art, first, as illustrated in FIG. 4(a), all three of the screws 12a, 12b and 12c are used to screw the connector 11 onto the printed circuit board 10. Next, the leads (not shown) of the connector 11 are soldered by flow soldering using lead-free solder, for example. At this time, as shown in FIG. 4(b), the heads of the screws 12a, 12b and 12c are also soldered with lead-free solder (indicated by the symbol 13). Once the lead-free solder 13 solidifies, the screws 12a, 12b and 12c are affixed and locked to the printed circuit board 10.

Here, as pointed out above, the coefficient of linear thermal expansion of the connector 11 is greater than (specifically roughly three times) that of the printed circuit board 10. Accordingly, when the printed circuit board 10 and connector 11 are heated with the soldering, the amount of deformation (amount of expansion) of the connector 11 exceeds that of the printed circuit board 10. The difference in the amount of deformation is particularly marked when using lead-free solder that has a higher melting point than conventional eutectic solder. The melting point of lead-free solder, specifically the ternary alloy Sn—Ag—Cu that has recently become the mainstream, is 220° C.

Thus, as shown in FIG. 4(b), the increase in the distances between the through holes 10a, 10b and 10c cut into the printed circuit board 10 becomes greater than the increase in the distances between the screw holes 11a1, 11b1 and 11c1 formed in the connector 11, so shifts in their relative positions occur. In addition, when these shifts in relative position occur, the screws 12a and 12c (i.e., the screws other than the screw 12b located at or near the center) move laterally within the through holes 10a and 10c and thus the relative positions of the screws 12a and 12c and through holes 10a and 10c change. The soldering of the heads of the screws 12a and 12c is conducted in this state.

Even when the screws 12a and 12c were firmly fastened to the screw holes 11a1 and 11c1 in the step indicated by FIG. 4(a), the inventors observed shifts in the relative positions of the screw holes 11a1 and 11c1 and through holes 10a and 10c, and the screws 12a and 12c were found to move laterally within the through holes 10a and 10c at the time of soldering. This is thought to be caused by the temperature of the connector 11 (more specifically the temperature of the screw holes 11a1, 11b1 and 11c1) reaching the low-load thermal deformation temperature at the time of soldering.

To explain this in more detail, when the connector 11 is made of PBT, its low-load thermal deformation temperature is roughly 116-191° C. However, when lead-free solder is used, the temperature of the screw holes 11a1, 11b1 and 11c1 reaches roughly 200° C. which is near the melting point of this solder.

Therefore, when soldering is performed using lead-free solder that has a high melting point, the screw holes 11a1, 11b1 and 11c1 of the connector 11 soften and the fastening force with the screws 12a, 12b and 12c is lowered, or in other words, the positional constraining force of the leg portions 11a, 11b and 11c with respect to the printed circuit board 10 is lowered.

It is conceived that when the connector 11 undergoes thermal expansion in this state (specifically, when it deforms in the direction such that the leg portions 11a and 11c move away from the leg portion 11b positioned in the center), the screws 12a and 12c move laterally within the through holes 10a and 10c.

The explanation with reference to FIG. 4 will be continued.

After the connector 11 and screws 12a, 12b and 12c are soldered, the printed circuit board 10 and connector 11 are cooled to room temperature. At this time, the screws 12a, 12b and 12c are locked by the solder 13 to the printed circuit board 10, so even if the printed circuit board 10 and connector 11 return to room temperature and contract, the positions of the screws 12a and 12c relative to the through holes 10a and 10c stay unchanged.

For this reason, in the cooling process, the printed circuit board 10 undergoes warp (bending) under pressure in the direction of contraction due to the force of contraction of the connector 11 that has a greater coefficient of linear thermal expansion (namely, greater amount of contraction).

In addition, the warp of the printed circuit board 10 also causes warp in the connector 11 itself which is attached to the board. As pointed out above, depending on the material used for the printed circuit board 10 and connector 11, this problem may also occur when using conventional eutectic solder that contains lead.

If the screws 12a, 12b and 12c are not soldered, then it is possible to prevent the occurrence of warp of the printed circuit board 10 and connector 11, but if this is done, there is a problem in that the strength of the connection between the printed circuit board 10 and connector 11 may not necessarily be adequate. For example, if the printed circuit board 10 is installed in a vehicle or the like, the connection may loosen due to vibration, so it is preferable for at least some of the plurality of screws to be soldered and locked.

The method of attaching an electronic component to a printed circuit board, and attachment structure thereof according to this invention overcomes this problem by soldering only some of the screws among the three screws 12a, 12b and 12c, thereby increasing the strength of the connection between the printed circuit board 10 and connector 11 while also preventing the occurrence of warp of the printed circuit board 10 and connector 11.

A detailed description of an embodiment of the invention will now be made with reference to FIG. 2 and FIG. 3.

First, in Step 1 of FIG. 2, as shown in FIG. 3(a), the connector 11 is placed on the mounting surface 10A side of the printed circuit board 10 with the screw holes 11a1, 11b1 and 11c1 aligned with the corresponding through holes 10a, 10b and 10c. Then, of the aforementioned three screws 12a, 12b and 12c, only the screw 12b is inserted into the through hole 10b from the solder surface 10B side, and screwed into the screw hole 11b1 which is formed in the center or thereabout of the connector 11. That is to say, one or some of the three screws is used to secure only the central portion of the connector 11 to the printed circuit board 10.

Next, in Step 2 of FIG. 2, as shown in FIG. 3(b), the leads (not shown) of connector 11 and the head of screw 12b are soldered onto the printed circuit board 10 with the lead-free solder 13 by flow soldering. Specifically, the soldering is performed by means of local flow soldering. Then, once the lead-free solder 13 solidifies, the screw 12b is affixed and locked to the printed circuit board 10. The aforementioned ternary alloy of Sn—Ag—Cu (with a melting point of roughly 220° C.) is used as the lead-free solder 13.

In this soldering process, the printed circuit board 10 and connector 11 are heated to a high temperature. Specifically, the temperature of the printed circuit board 10 is raised to roughly 220° C., nearly equal to the melting point of the solder 13, and that of the connector 11 is raised to roughly 160° C. (with the area near the screw holes 11a1, 11b1 and 11c1 positioned at the bottom reaching roughly 200° C.).

Accordingly, the connector 11 which has a coefficient of linear thermal expansion nearly three times that of the printed circuit board 10 deforms or expands by a much greater amount than the printed circuit board 10. Specifically, the amount of increase in the distance between the three screw holes 11a1, 11b1 and 11c1 formed in the connector 11 is greater than the amount of increase in the distance between the three through holes 10a, 10b and 10c cut in the printed circuit board 10.

Thus, as shown in the drawing, the positions of the screw holes 11a1, 11c1 shift relative to the through holes 10a, 10c, except for the screw hole 11b1 and through hole 10b in the center or thereabout which are fixed by means of screw 12b. Specifically, the screw hole 11a1 shifts relative to the through hole 10a at the left edge and the screw hole 11c1 shifts relative to the through hole 10c at the right edge.

Next, in Step 3 of FIG. 2, the printed circuit board 10 and connector 11 are cooled down to a predetermined temperature (room temperature; e.g., 20° C.). At this time, the printed circuit board 10 and connector 11 contract, but the through holes 10a and 10c and screw holes 11a1 and 11c1 are not screwed together (and no soldered screw is present therein), so the different amounts of contraction of the printed circuit board 10 and connector 11 do not interfere with each other. For this reason, as shown in FIG. 3(c), the printed circuit board 10 and connector 11 return to their initial states at cooled, thereby eliminating the shift in the positions of the through holes 10a and 10c relative to the screw holes 11a1 and 11c1.

Next, in Step 4 of FIG. 2, as shown in FIG. 3(d), the screws 12a and 12c are inserted into the through holes 10a and 10c from the solder surface 10B side of the printed circuit board 10, and screwed into the screw holes 11a1 and 11c1. Thus, of the three screws, the remaining (i.e., two) screws are used to secure the left and right edge portions of the connector 11 to the printed circuit board 10. With this, the structure of attaching the connector to the printed circuit board described in reference to FIG. 1 is obtained.

In this manner, the method of attaching electronic components to the printed circuit board according to this embodiment comprises: Step 1 wherein, of the three screws 12a, 12b and 12c, the screw 12b is used to screw the connector 11 onto the printed circuit board 10; Step 2 wherein (the leads of) the connector 11 and (the head of) the screw 12b are flow soldered onto the printed circuit board 10 with the lead-free solder; Step 3 wherein the printed circuit board 10 and connector 11 are cooled down to the predetermined temperature; and Step 4 wherein, after the printed circuit board 10 and connector 11 have been cooled down to the predetermined temperature, the remaining screws 12a and 12c are used to screw the connector 11 onto the printed circuit board 10, thereby securing the entire connector 11 to the printed circuit board 10.

With these steps, the strength of the connection of the connector 11 to the printed circuit board 10 can be increased and also the occurrence of warp in the printed circuit board 10 and connector 11 can be prevented.

Specifically, by soldering and locking some of the screws (the one screw 12b in the foregoing embodiment), the strength of the connection of the connector 11 to the printed circuit board 10 can be increased in comparison with the case in which no screws are soldered.

In addition, by fastening the remaining screws 12a and 12c after the printed circuit board 10 and connector 11 return to the initial state at cooled, it is possible to prevent the different amounts of contraction of the printed circuit board 10 and connector 11 in the cooling process from interfering with each other via the screws, and thus even when the lead-free solder 13 with a high melting point is used (namely, when a large difference in the amount of thermal expansion occurs between the printed circuit board 10 and the connector 11), it is possible to prevent warp of the printed circuit board 10 and connector 11 from occurring.

In addition, with the structure of attaching the electronic component to the printed circuit board according to this embodiment, of the three screws 12a, 12b and 12c that secure the connector 11 to the printed circuit board 10, only screw 12b is covered with solder (the lead-free solder 13) and thus affixed to the printed circuit board 10. As a result, the strength of the connection of the connector 11 to the printed circuit board 10 can be increased and also the occurrence of warp in the printed circuit board 10 and connector 11 can be prevented.

Specifically, by soldering and locking some of the screws (e.g., the one screw 12b), the strength of the connection of the connector 11 to the printed circuit board 10 can be increased in comparison with the case in which no screws are soldered. In addition, by not soldering the remaining screws 12a and 12c, it is possible to prevent the different amounts of contraction of the printed circuit board 10 and connector 11 in the cooling process from interfering via the screw, and thus even when the lead-free solder 13 with a high melting point is used (namely, when a large difference in the amount of thermal expansion occurs between the printed circuit board 10 and the connector 11), it is possible to prevent warp of the printed circuit board 10 and connector 11 from occurring.

In addition, with the method of attaching electronic components to the printed circuit board and attachment structure thereof according to this embodiment, since the screw 12b is the screw that is screwed into the center or thereabout of the connector 11, the work of fastening the remaining screws 12a and 12c can be simplified.

To explain this in detail, depending on the material used for the electronic component, there are cases in which the amount of shrinkage after thermal expansion exceeds the amount of thermal expansion, or namely the electronic component may shrink down further than the initial state prior to thermal expansion (become smaller than in the initial state). At this time, the shift in position of the screw holes of the electronic component relative to the corresponding through holes of the printed circuit board that occurs due to contraction after thermal expansion becomes larger further away from the location at which the electronic component is secured to the printed circuit board (namely the position of the screw that is soldered and locked).

For example, if the connector 11 is screwed down with the screw 12c and the screw 12c is soldered and locked, the shift in position between the screw hole 11a1 and the through hole 10a that occurs due to shrinkage after thermal expansion would be greater than that between the screw hole 11b1 and the through hole 10b which are positioned at locations nearer to the screw 12c.

However, in this embodiment, since the screw 12b that is soldered and locked is the screw that is screwed into the center or thereabout of the connector 11, the distance of separation of the remaining screws 12a and 12c that are tightened after soldering can be made smaller. Thus, since it is possible to suppress the position shifts occurring between the screw holes 11a1 and 11c1 and the through holes 10a and 10c, the work of tightening the screws 12a and 12c can be simplified.

As stated above, this embodiment is configured to have a method of attaching an electronic component (e.g., connector 11) to a printed circuit board (10) by a plurality of screws (12a, 12b, 12c) that are inserted into corresponding through holes (10a, 10b, 10c) cut in the board from a surface of the board (solder surface 10B) and then screwed into corresponding screw holes (11a, 11b, 11c) formed in the component (11) mounted on an opposite surface (mounting surface 10A), comprising the steps of: (a) screwing the component (11) onto the board (10) using one (12b) of the screws (Step 1); (b) flow soldering the component (11) and the screw (12b) onto the board (Step 2); (c) cooling down the component (11) and the board (10) to a predetermined temperature, e.g., a room temperature (Step 3); and (d) screwing the component (11) onto the board (10) using remaining screws (12a, 12c) to secure the component to the board, after the component and the board have been cooled down to the predetermined temperature (Step 4).

In the method, the component (11) and the screw (12b) are flow soldered onto the board (10) with lead-free solder in step (b), and the lead-free solder comprises a ternary alloy of Sn—Ag—Cu.

In the method, the component (11) is screwed on the board (10) using one (12b) of the screws that is to be threaded to at or near the center of the component (11) in step (d).

In the method, three screws (12a, 12b, 12c) are inserted into the corresponding through holes cut in the board (10), and the component (11) is screwed onto the board using one (12b) of the three screws in step (a).

This embodiment is also configured to have a structure of attaching an electronic component (11) to a printed circuit board (10) by a plurality of screws (12a, 12b, 12c) that are inserted into corresponding through holes (10a, 10b, 10c) cut in the board (10) from a surface of the board (solder surface 10B) and then screwed into corresponding screw holes formed in the component mounted on an opposite surface (mounting surface 10A), wherein the improvement comprises: one (12b) of the screws (12a, 12b, 12c) is soldered and attached to the board (10).

In the structure, the one (12b) of the screws is a screw that is to be threaded to at or near the center of the component (11).

In the structure, three screws (12a, 12b, 12c) are inserted into the corresponding through holes (10a, 10b, 10c) cut in the board, and one (12b) of the three screws is soldered attached to the board (10).

It should be noted that, although it has been mentioned that the screw 12b tightened before soldering is used to screw down the center or thereabout of the connector 11, the location that is screwed down need not be exactly the center, but can be anywhere near the center.

It should also be noted that, although the (total) number of screws used has been given as three, two or four or more screws may be used.

It should further be noted that, although the explanation has been made using the connector 11 as an example of an electronic component or a part that is screwed down, other electronic components may also be used. Moreover, the materials used for the printed circuit board 10 and connector 11 are not limited to those given above.

It should further be noted that, although the connector 11 and screw 12b are soldered using the lead-free solder 13, conventional eutectic solder containing lead may also be used. Moreover, although the composition of the lead-free solder 13 has been given as Sn—Ag—Cu, but lead-free solder of other compositions may also be used.

Japanese Patent Application No. 2004-199118 filed on Jul. 6, 2004, is incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A method of attaching an electronic component to a printed circuit board by a plurality of screws that are inserted into corresponding through holes cut in the board from a surface of the board and then screwed into corresponding screw holes formed in the component mounted on an opposite surface, comprising the steps of:
    (a) screwing the component onto the board using one of the screws;
    (b) flow soldering the component and the screw onto the board;
    (c) cooling down the component and the board to a predetermined temperature; and
    (d) screwing the component onto the board using remaining screws to secure the component to the board, after the component and the board have been cooled down to the predetermined temperature.

2. The method according to claim 1, wherein the component and the screw are flow soldered onto the board with lead-free solder in step (b).

3. The method according to claim 2, wherein the lead-free solder comprises a ternary alloy of Sn—Ag—Cu.

4. The method according to claim 1, wherein the component is screwed on the board using the one of the screws that is to be threaded to at or near a center of the component in step (d).

5. The method according to claim 1, wherein three screws are inserted into the corresponding through holes cut in the board, and the component is screwed onto the board using the one of the three screws in step (a).

* * * * *